(12) United States Patent
Perry

(10) Patent No.: US 7,360,196 B1
(45) Date of Patent: Apr. 15, 2008

(54) TECHNOLOGY MAPPING FOR PROGRAMMING AND DESIGN OF A PROGRAMMABLE LOGIC DEVICE BY EQUATING LOGIC EXPRESSIONS

(75) Inventor: Steven Perry, High Wycombe (GB)

(73) Assignee: Altera Corporation, San Jose, CA (US)

( * ) Notice: Subject to any disclaimer, the term of this patent is extended or adjusted under 35 U.S.C. 154(b) by 239 days.

(21) Appl. No.: 10/859,842

(22) Filed: Jun. 2, 2004

(51) Int. Cl.
G06F 17/50 (2006.01)
(52) U.S. Cl. .............................. 716/17; 716/1; 716/18
(58) Field of Classification Search .................... 716/1, 716/2, 17, 18
See application file for complete search history.

(56) References Cited

U.S. PATENT DOCUMENTS

| | | | | |
|---|---|---|---|---|
| 5,128,871 | A | * | 7/1992 | Schmitz ........................ 716/17 |
| 5,132,975 | A | * | 7/1992 | Avaneas ...................... 714/757 |
| 5,610,829 | A | * | 3/1997 | Trimberger ................... 716/16 |
| 5,754,753 | A | * | 5/1998 | Smelser .......................... 714/8 |
| 2004/0145942 | A1 | * | 7/2004 | Leijten-Nowak ............. 365/154 |

OTHER PUBLICATIONS

Greaves, D.J., "Direct Synthesis of Logic Using SAT Solver: The HPRLS Project (Research Note)," http://www.cl.cam.ac.uk/users/dig/wwwhpr/dslogic.html, accessed on May 27, 2004 by http://web.archive.org.
"Data Conserving Channel Primitives," http://www.cl.cam.ac.uk/users/dig/wwwhpr/conserve.html, accessed on Jun. 24, 2004 by http://web.archive.org.
"Direct Synthesis of Logic Using a SAT Solver: Almost Trivial, divide by 3 example," http://www.cl.cam.ac.uk/users/dig/wwwhpr/div3ex.html, accessed on Jun. 24, 2004 by http://web.archive.org.
"Data Transfer Protocol Designs Generated by SAT: Second example: Two Rail Coding," http://www.cl.cam.ac.uk/users/dig/wwwhpr/tworail.html, accessed on Jun. 24, 2004 by http://web.archive.org.
"The HPRLS Project: Handling GPIB in H2," http://www.cl.cam.ac.uk/users/dig/wwwhpr/gpibpage.html, accessed on May. 27, 2004 by http://web.archive.org.
Greaves, David, "Automated Hardware Synthesis from Formal Specification Using SAT Solvers," presented at the International Workshop on Rapid System Prototyping on Jun. 28, 2004.
Nam, Gi-Joon et al., "Satisfiability-Based Layout Revisited: Detailed Routing of Complex FPGAs Via Search-Based Boolean SAT," *ACM/SIGDA International Symposium on Field Programmable Gate Arrays (FPGA '99)*, pp. 167-175 (Feb. 21-23, 1999).

* cited by examiner

*Primary Examiner*—Thuan Do
(74) *Attorney, Agent, or Firm*—Ropes & Gray LLP; Jeffrey H. Ingerman

(57) ABSTRACT

A programmable logic device ("PLD") architecture and a user logic design are modeled logically to find an efficient programming solution for the user logic design on the PLD architecture. The logical models are converted to equations—e.g., by representing them as binary decision diagrams which can be modeled and manipulated mathematically with commercially available tools. The equations can be solved for the programming or configuration variables. Similarly, an efficient programmable logic device architecture for implementing one or more of a given set of logic functions can be found by mapping each function in the set of functions onto a generic architecture and solving for the configuration variables. By comparing the results for all functions, one can reduce the generic architecture to an efficient architecture for that set of functions by eliminating structures from the generic architecture whose configuration bits are the same for all solutions.

18 Claims, 6 Drawing Sheets

TECHNOLOGY MAPPING FOR PROGRAMMING AND DESIGN OF A PROGRAMMABLE LOGIC DEVICE BY EQUATING LOGIC EXPRESSIONS

BACKGROUND OF THE INVENTION

This invention relates to the use of technology mapping for programming or designing a programmable logic device ("PLD"). In particular, this invention relates to using logical equivalency checking to find more efficient programming solutions for implementing user logic in a programmable logic device of a particular architecture, and also to find a more efficient architecture to implement a particular logical problem.

Programmable logic devices are well known. Early programmable logic devices were one-time configurable. For example, configuration may have been achieved by "blowing"—i.e., opening—fusible links. Alternatively, the configuration may have been stored in a programmable read-only memory. Those devices generally provided the user with the ability to configure the devices for "sum-of-products" (or "P-TERM") logic operations. Later, such programmable logic devices incorporating erasable programmable read-only memory (EPROM) for configuration became available, allowing the devices to be reconfigured.

Still later, programmable logic devices incorporating static random access memory (SRAM) elements for configuration became available. These devices, which also can be reconfigured, store their configuration in a nonvolatile memory such as an EPROM, from which the configuration is loaded into the SRAM elements when the device is powered up. These devices generally provide the user with the ability to configure the devices for look-up-table-type logic operations.

While it may have been possible to program the earliest programmable logic devices manually, simply by determining mentally where various elements should be laid out, it was common even in connection with such earlier devices to provide programming software that allowed a user to lay out logic as desired and then translate that logic into programming for the programmable logic device. With current larger devices, it would be impractical to attempt to lay out the logic without such software.

One characteristic, however, of PLD programming software is that it is good at finding a solution that works—i.e., that implements the user logic design in a target PLD—but for certain user logic designs it may not find the best—i.e., the fastest or most efficient—solution, except by happenstance. A skilled user may even be able to recognize after the fact that, at least for a portion of the design, there is a better solution than the one found by the software. And while some PLD programming software provides a facility for a user to dictate a specific solution for at least a portion of the design—e.g., the QUARTUS® II software available from Altera Corporation, of San Jose, Calif., provides such a facility known as the "WYSIWYG Atom Mode"—those facilities are typically beyond the skill level of most users.

In addition, PLDs typically are designed to be as generic as possible. As a result, just as PLD programming software does not always find the best solution for implementing certain user logic designs, so too are PLD hardware designs not always optimal for certain user logic designs.

It would be desirable to be able to provide a method for programming a PLD that could find a more efficient solution for implementing at least a portion of a given user logic design. It also would be desirable to be able to provide a method for designing at least a portion of a PLD that is more optimal for a given user logic design.

SUMMARY OF THE INVENTION

The present invention reduces the problem of programming a given PLD with a given user logic design, as well as the problem of designing a PLD based on a user logic design, to a data-driven problem that can be solved rigorously. Although there may not be a unique solution, the solutions that are found can be expected to be more efficient in terms of, e.g., one or more of speed, numbers of logic elements ("LEs") used, etc. And because the problem becomes one of data, one can choose which variables to fix, and which to leave as variables, allowing the invention to be used to find a programming solution for a given architecture, or to find an architecture that would best suit a particular user logic design.

A user logic design, by definition, can be expressed as a logic function—e.g., a Boolean logic function. Similarly, in accordance with the present invention, a PLD architecture also can be expressed as a logic function—e.g., a Boolean logic function. For example, a logic element of the type used in PLDs made by Altera Corporation, of San Jose, Calif., can be modeled as a logic cone, of two-input multiplexers, which can be translated into a logic function of the configuration bits (inputs to the widest level of the logic cone) and the control bits of the multiplexers. In accordance with the invention, the logical modeling of the PLD architecture includes modeling, as logic, elements of the architecture that do not exist as logic in the physical device. For example, routing elements can be expressed for this purpose as logic—e.g., as multiplexers. Similarly, for logic elements that can be used in either a logic mode or an arithmetic mode, the mode selection also can be expressed as logic— again, e.g., as a multiplexer.

Once the user logic design and the target architecture have been modeled as logic functions, those logical functions can be subject to equivalency checking as the configuration bits are varied, until an equivalent result is obtained. Conceptually, this involves combining the outputs of the two functions using an exclusive-OR gate, which outputs a logical 0 only when the two logic functions are equivalent, and permuting the configuration bits of the function representing the architecture, until the output of the exclusive-OR is a logical 0.

Computationally, the logic functions preferably are expressed in a form that is amenable to calculation. For example, Boolean logic functions representing the user logic design and the target architecture can be expressed as binary decision diagrams ("BDDs"). Although BDDs can be thought of diagrammatically, commercially available tools are available to express logical functions as BDDs, and to manipulate them computationally. For example, one such tool, using a technique known as "universal quantification," can be used to derive a set of simultaneous equations in which the variables are the configuration bits (in a look-up-table-type architecture, these can be the look-up table bits as well as bits controlling other selections such as routing selections). The user inputs drop out, as they are inputs to both the user logic design and the programmed architecture, leaving a set of simultaneous equations which can be solved for the configuration bits, which can be written out to a file containing a structural piece of Register Transfer Language (e.g., Verilog or VHDL).

While this technique is expected to produce an efficient solution for the configuration of a selected piece of the user logic design, it should be noted that there may be more than one solution. That is, for a given set of simultaneous equations, the solution may not include a 0 or 1 for every configuration bit. For example, there may be a pair of bits that can take either value (0 or 1), as long as they are the same as (or different from) one another. In some such cases, it truly may not matter, while in other such cases the user may be able to determine that one particular choice is superior—e.g. because certain inputs are physically closer to their signal sources, or because a choice results in usage of fewer LEs, or fewer multiplexers or gates, etc. If the user believes the choice does not matter, the first working solution can be used. Alternatively, the user could constrain the problem from the beginning—i.e., assign certain values to the bits in question—and then either stop as soon as one version of the constrained problem produces a working result, or compare all of the different solutions produced by the different constrained versions.

It should further be noted that it is also possible in some cases that no solution will be found. Because the technique according to the present invention is computational, the failure to find a solution may be interpreted as meaning that no solution exists.

While the technique of the invention theoretically can be used to program an entire user logic design onto a target PLD, it is computationally intensive (at least for current computers) and therefore impractical for such a use, as it would result in programming times that are unacceptably long. However, the invention can be used where a user would like to optimize a particular discrete portion of the design. Or the user may use conventional tools to analyze a design as implemented by conventional programming software and determine that in a particular portion of the design, device resources are being used inefficiently—e.g., too many LEs per unit area are being used, or too much logic is being used along a critical path. The user could then apply the present invention to that portion of the design.

It may be possible to use the invention for larger portions of a PLD if there is a way to restrict the routing in the model. For example, if a bus has eight conductors, each connection of an element to the bus can be modeled as eight n:1 multiplexers, where n is the number of inputs/outputs to/from that element, but large multiplexers translate to large BDDs, which translates into an intractable problem. However, it may be possible to reduce the amount of routing that is modeled while keeping the model non-blocking—i.e., without reducing the flexibility of the routing by making unavailable in the model a connection that exists in the device being modeled. For example, Benes networks may be used to reduce the amount of routing needed without blocking any connections. An alternative solution would be to construct the model with two nested loops. The outer loop would vary the variables related to routing, while the inner loop would vary all of the other variables. Thus, for each instance of the inner loop, the routing is essentially fixed, and the inner loop will either quickly find a solution, or quickly fail to find a solution in a case, as described above, in which there is no solution. User guidance in controlling the number of instances of the inner loop—e.g., by determining whether or not, based on user knowledge of the design, all possible values of the outer loop index variable should be tried—could further reduce the amount of computation required.

The invention has been described up to now as being used for fitting a user logic design to a device architecture that has already been fixed. However, because it reduces the fitting problem to a computational problem involving variables representing the architecture and variables representing user inputs and configuration inputs, the technique of the invention can be used to solve for any of those variables. Thus, by solving for the variables representing the architecture, a device designer can use the invention to optimize a design for a particular user problem for which the design heretofore has not been efficient. Again, the technique of the invention is too computationally intensive (for current computers) to be able to design an entire device, but it could be used to design a portion of a device.

Thus, in accordance with the present invention, there is provided a method of programming a programmable logic device, which method includes deriving a first logic function that represents at least a portion of the programmable logic device, deriving a second logic function that represents a user logic design to be programmed onto that at least a portion of the programmable logic device, and mapping the second logic function onto the first logic function. There is also provided a method of designing a programmable logic device to implement a particular user logic design, which method includes deriving a first logic function that represents at least a portion of the programmable logic device, deriving a second logic function that represents a user logic design to be programmed onto that at least a portion of the programmable logic device, and mapping the first logic function onto the second logic function. A programmable logic device designed or programmed in accordance with those methods is also provided.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

The invention will now be described with reference to FIGS. 1-7.

PLDs of the type with which the present invention may be used are typically based on look-up-table-type logic LEs. For example, LEs in PLDs from Altera Corporation, of San Jose, Calif., typically are based on 4-input look-up tables (4-input "LUTs" or "4-LUTs"). However, for purposes of illustration, it is less cumbersome to consider a 3-input look-up table ("3-LUT"), which may be represented logically by half the number of components as compared to a 4-LUT.

Figure 1:
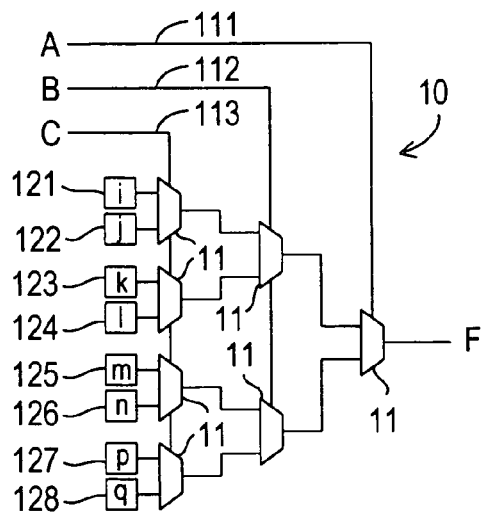
FIG. 1 is a schematic logical representation of a logic element of a programmable logic device with which the present invention may be used.

FIG. 1 shows an LE 10 as a 3-LUT represented logically as a logic cone or tree of seven 2:1 multiplexers 11, with the multiplexer control inputs being the look-up table inputs A (111), B (112), C (113), and the multiplexer data inputs being the PLD configuration bits i, j, k, l, m, n, p, q 121-128. The "vector" of values of configuration bits 121-128 is sometimes referred to as the "LUTmask" of the LUT or LE.

The truth table for LE 10, in terms of the configuration bits, is as follows:

| A | B | C | F |
|---|---|---|---|
| 0 | 0 | 0 | i |
| 0 | 0 | 1 | j |
| 0 | 1 | 0 | k |
| 0 | 1 | 1 | l |
| 1 | 0 | 0 | m |
| 1 | 0 | 1 | n |
| 1 | 1 | 0 | p |
| 1 | 1 | 1 | q |

As an example, suppose it is desired to program LE 10 to perform a three-input AND function F=A·B·C, for which the output F is high only when all three inputs A, B, C are high. For a three-input AND function, F=1 only when A=B=C=1. Therefore, configuration bit q should be 1 and all other configuration bits should be 0. This simple problem can be solved essentially by inspection.

A generic problem—whether simple or complex—may not be solvable by inspection. In accordance with the invention, however, any problem may be solved using the equivalency check 20 shown in FIG. 2.

Conceptually, the problem to be solved is modeled as a logic function 21, producing output G from inputs A, B and C. Thus, a three-input AND-gate is shown in phantom inside logic function 21, representing the example under consideration. Similarly, logic element 10 is modeled as logic function 22 as discussed above, producing output F. For this reason, the structure shown in FIG. 1 is shown in phantom inside logic function 22. An exclusive-OR (XOR) gate 23 takes functions F and G as inputs, and provides a 0 output whenever F and G are the same (as is the nature of the exclusive-OR function).

Figure 2:
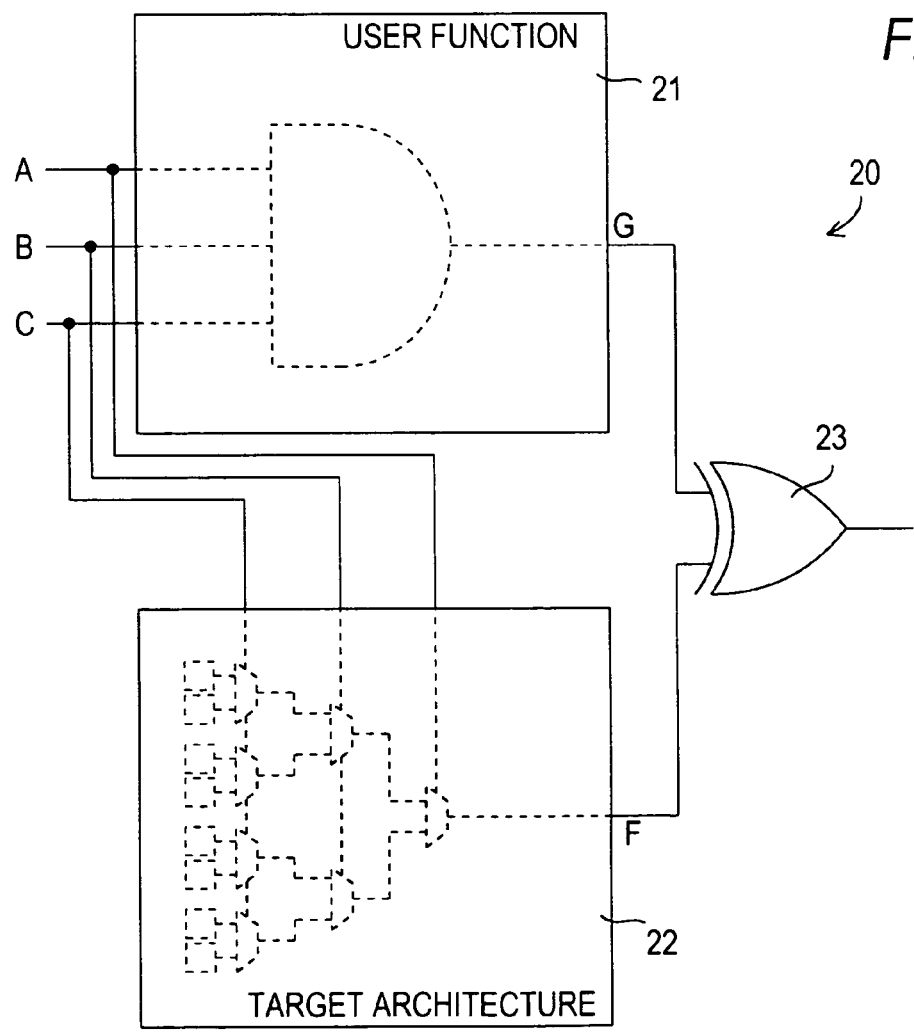
FIG. 2 is a generic schematic diagram of the equivalency check made in accordance with the present invention.

Again conceptually, the configuration vector or LUTmask necessary for the logic function 22 to be a three-input AND function could be determined by building, in hardware, the structure shown in FIG. 2, including the portions shown in phantom, and varying the eight configuration bits until the desired result was obtained as indicated by a logical 0 output from XOR-gate 23 or all values of A, B and C. The same could be done for any other function.

However, building each circuit in hardware to determine the configuration bits by trial-and-error is neither fast nor efficient. Moreover, in accordance with the invention, and as explained in more detail below, the model for function F may include components that are not present in the actual logic element—e.g., there may be logical components added to the model to represent routing and mode selection. Therefore, a computational solution is provided in accordance with the present invention, allowing function G to be mapped onto function F using computational techniques. In accordance with a preferred embodiment, that computation is carried out using binary decision diagrams ("BDDs").

Figure 3:
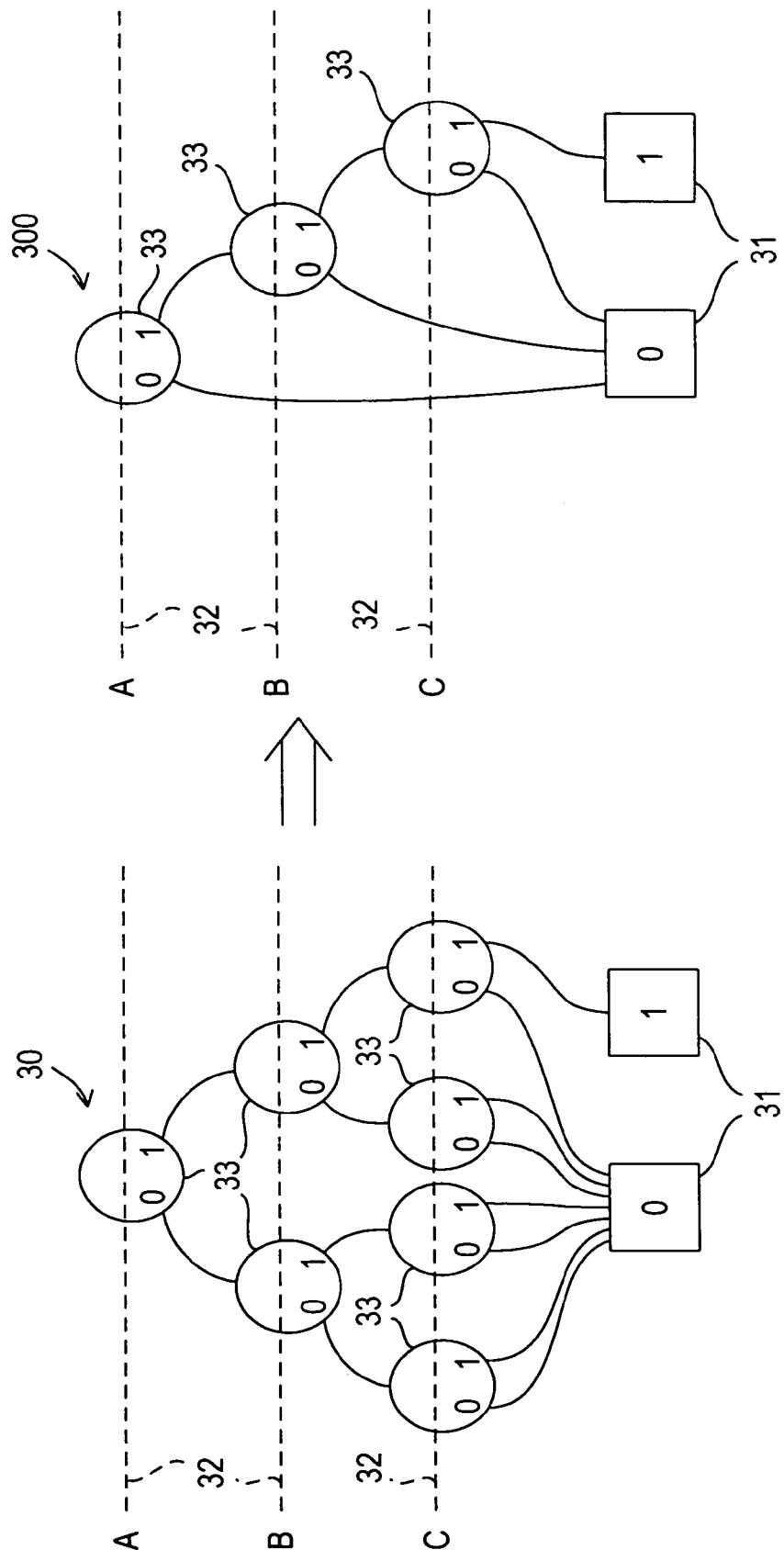
FIG. 3 is a representation of a binary decision diagram for a three-input AND function.

A binary decision diagram 30 for implementing a three-input AND function (again used only as an example) in LE 10 is shown in FIG. 3. At the bottom are the outputs 31, which may be either 0 or 1, although in some cases, such as for a model of a tristate device, there would be a third possible state of OFF. Each of the horizontal broken lines 32 represents one of the control inputs A, B, C. Each of circles 33 represents a binary decision corresponding, in this case, to one of 2:1 multiplexers 11. Because for this particular function, most of the configuration bits are 0, for many of circles 33 the output is the same regardless of the state of the control input 32. Thus the BDD can be collapsed to BDD 300.

Although, as the name implies, BDDs are diagrams, they can be represented computationally using available software tools such as CUDD, which is available from the University of Colorado at Boulder, Engineering Center, EE 1B61, Boulder, Colo. 80309 (http://vlsi.colorado.edu/~fabio/CUDD/cuddIntro.html), or BuDDy, which is available from IT University of Copenhagen, Glentevej 67, DK-2400 Copenhagen Nev. (http://www.itu.dk/research/buddy/), and thus manipulated computationally—e.g., using Boolean algebra. Accordingly, if respective BDDs can be generated to represent the LE and the user logic design, each can be reduced to a set of one or more equations in which the variables are the user inputs (common to the LE representation and the user logic design representation) and the configuration bits (only in the LE representation). The user inputs would drop out, leaving a solution for the configuration bits.

Although in the simple AND-gate example discussed up to this point, all of the elements of the logic model for the LE represent real logic components in the LE, that may not be the case for more complex structures. It may be that other components would have to be represented by logic components in the logic model, even though in reality they are not normally considered to be logic components. Two such components are routing and mode selection.

Figure 4:
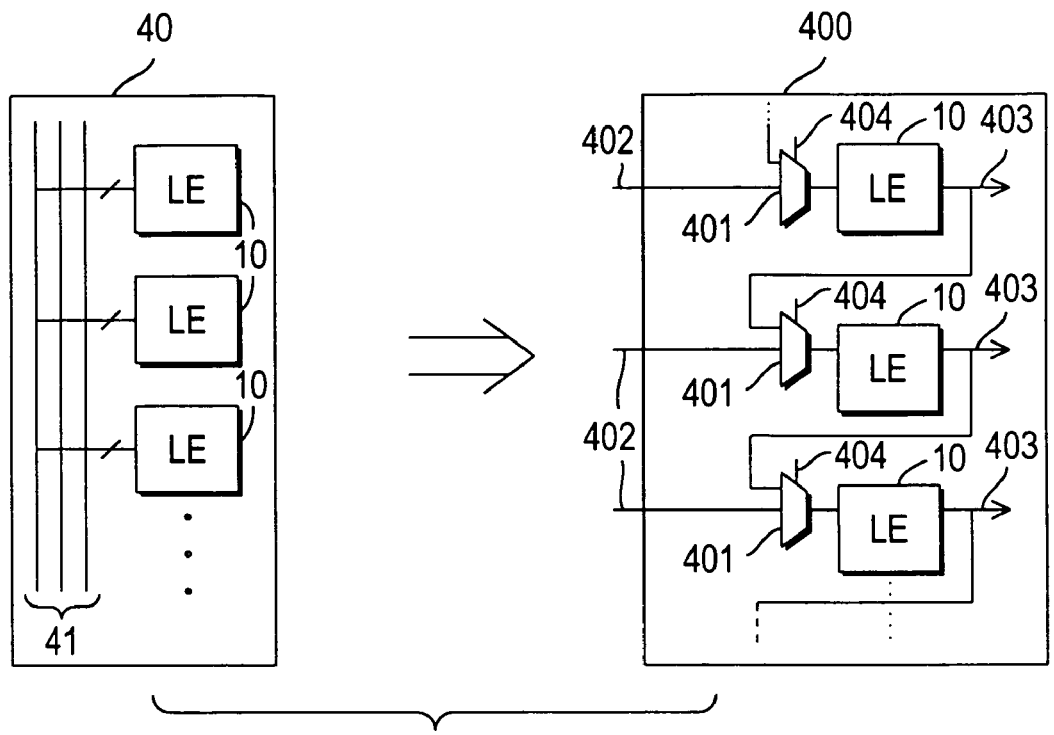
FIG. 4 is a representation of a portion of a programmable logic device showing how routing may be represented by a multiplexer.

FIG. 4 illustrates how routing may be modeled as logic. A simplified logic array block ("LAB") 40 includes a plurality of LEs 10 (three shown) and some intra-LAB routing conductors 41 which can connect to both the inputs and outputs of LEs 10 and, via other routing, to signals external to LAB 40. This is the actual LAB structure, represented schematically. For logic modeling purposes, however, LAB 40 can be represented by structure 400, in which multiplexers 401, each capable of selecting, as an input to an LE 10, either the output 403 of at least one other LE 10, or an external signal 402. In the computational representation of model 400, a variable representing the control input 404 to multiplexer 401 is a routing variable.

Figure 5:
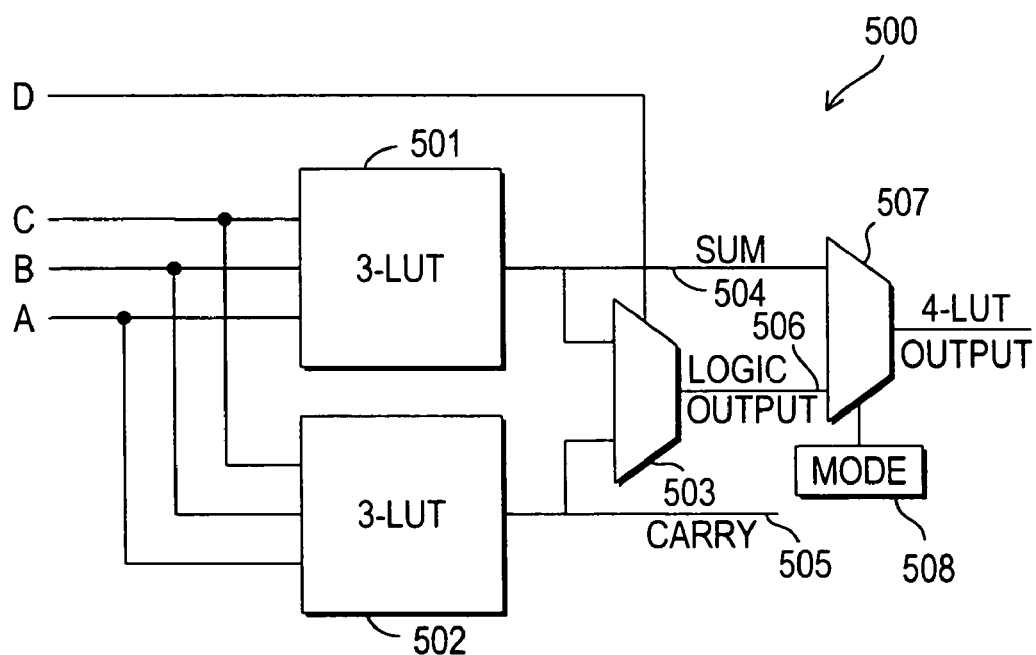
FIG. 5 is a representation of a portion of a programmable logic device showing how mode selection may be represented by a multiplexer.

Similarly, FIG. 5 shows how mode selection may be modeled as logic. FIG. 5 is a schematic representation of a 4-LUT 500, which effectively includes two 3-LUTs 501, 502, each similar to LE 10, sharing the same three inputs A, B, C. The outputs of 3-LUTs 501, 502 are combined by a multiplexer 503 under the control of a fourth input D when 4-LUT 500 is used for logic functions. However, 4-LUT 500 also may be used for arithmetic functions, in which case 3-LUT 501 may compute a sum 504 while 3-LUT 502 may compute a carry value 505. The carry value 505 may be conducted elsewhere directly, but sum 504 and logical output 506 of multiplexer 503 are both input to a further multiplexer 507 to output either logic function 506 or sum 504 under the control of mode selection input 508, which select between logic mode and arithmetic mode. Multiplexer 507/input 508, which control mode selection, are true logic elements, and thus it is easy to see how mode selection may be included in the model as logic.

Figure 6:
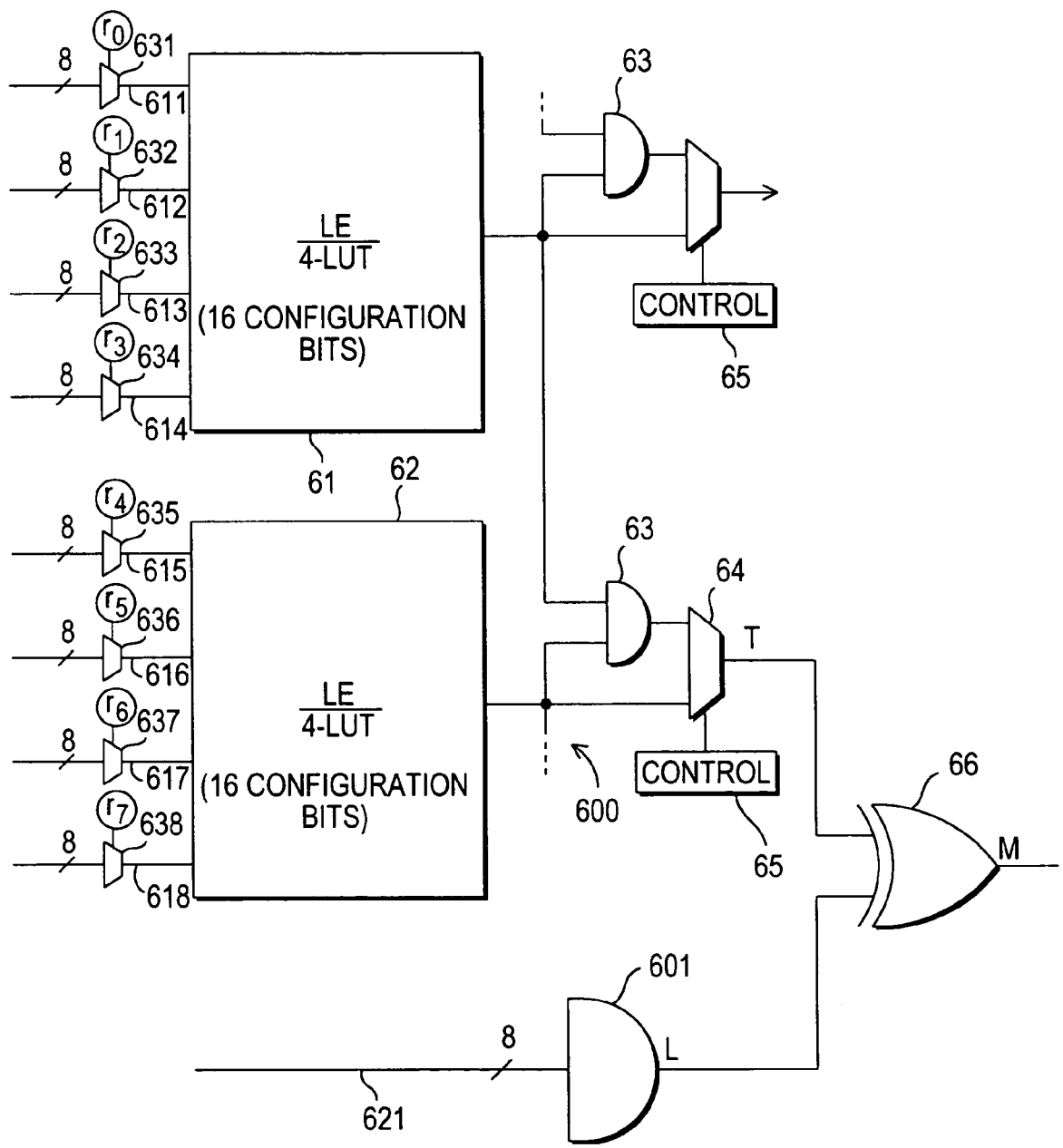
FIG. 6 is a schematic diagram similar to FIG. 2 for evaluating a more complex function.

FIG. 6 shows an example of a more complex logic function, which also includes a different example of mode selection as a variable to be modeled. The APEX family of PLDs available from Altera Corporation includes LEs 61, 62 based on 4-LUTs (each having sixteen configuration bits), but also includes an AND-gate 63 that allows two 4-LUTs to be cascaded. Thus, for example, two 4-LUTs can be used to create an 8-input AND function (AND8). AND-gate 63 of each LE/4-LUT 61, 62 also can be bypassed, allowing each 4-LUT to be used individually. In the AND8 example, the second LE/4-LUT 62 would be configured to use its AND gate 63 to accept the output of the first LE/4-LUT 61. For modeling purposes, this is represented by a multiplexer 64, which is not present in the actual device. The control bit 65 for multiplexer 64 is one of the variables in the model.

Thus, in FIG. 6, 600 represents the model of the target device, while 601 represents the model of the AND8 function. Note that because model 600 is a model of the target device for the purpose of cascading two LEs to create an eight-input AND function, it does not include a cascade AND-gate associated with LE 61, and present in the actual device, that might be used to cascade LE 61 with another LE (not shown). Similarly, the model does not include the cascade connections to other LEs that are present in the actual device.

A function L, whose variables are the eight user inputs at 621, represents the AND8 function. A function T represents the target architecture. Its variables include the configuration bits (thirty-two in all) of both LEs 61, 62, the eight user inputs, all of which may be introduced, one at a time, at any one of the eight inputs 611-618, under control of respective routing inputs $r_i$ (i=1 . . . 8) of multiplexers 631-638 which also are variables, and variables 65 in each LE 61, 62 representing whether or not the cascade is used. Function M, the result of the XOR 66 of functions A and T, is the calculated solution, which for the AND8 function results in each LE 61, 62 having configuration bits 8000H (one 1 and fifteen 0's), suitable $r_i$ to select one distinct bit each on each user input (the order is not important as the inputs are permutable in an AND function), and mode selection variables set to use the cascade function in LE 62 but not in LE 61. Again, this is a problem that can be solved by inspection but it illustrates how more complex problems may be approached. As discussed above, rather than providing absolute values (0 or 1) for each configuration bit, the solution may provide absolute values for some of the configuration bits, while expressing other configuration bits in terms of each other—e.g., two bits must be the same as each other and different from a third bit but the actual values do not matter (although there may be other consequences as discussed above that dictate a preference for one set of possible values over another).

As stated above, the present invention cannot practically be used to program an entire PLD. Small sections, identified as described above, can be selected for application of the technique of the invention. How large those sections can be is a function of, among other things, routing, because as more LEs are included, the amount of routing resources that must be modeled increases rapidly. The size of the problem that can be modeled according to this invention would increase if the amount of routing to be modeled can be decreased. However, in decreasing the routing to be modeled, actual available connectivity cannot be eliminated from the model. One solution is to use the loop technique described above, where one variable is held constant in an outer loop while a more manageable problem is solved in an inner loop, with the outer loop then varied to explore the effects of varying that other variable, which may represent routing choices.

Another solution is to model the available routing using a model with a reduced number of possible combinations. The routing scheme shown in FIG. 6 applies all eight user inputs to each of eight multiplexers 631-638. Each multiplexer selects one user input to apply to its respective LE. Rigorous examination of the routing would require testing $8^8$, or over 16,000,000, possible combinations. However, since the purpose of these multiplexers is to permute the user inputs into different orderings, there are in fact only 8!, or about 40,000, valid combinations. These valid combinations require selecting a different input at each of the multiplexers 631-638. Instead of trying to enforce this restriction when solving for the unknown variable bits, the routing model itself can be made more restricted. An example of a more restricted non-blocking model is a Benes network.

Figure 7:
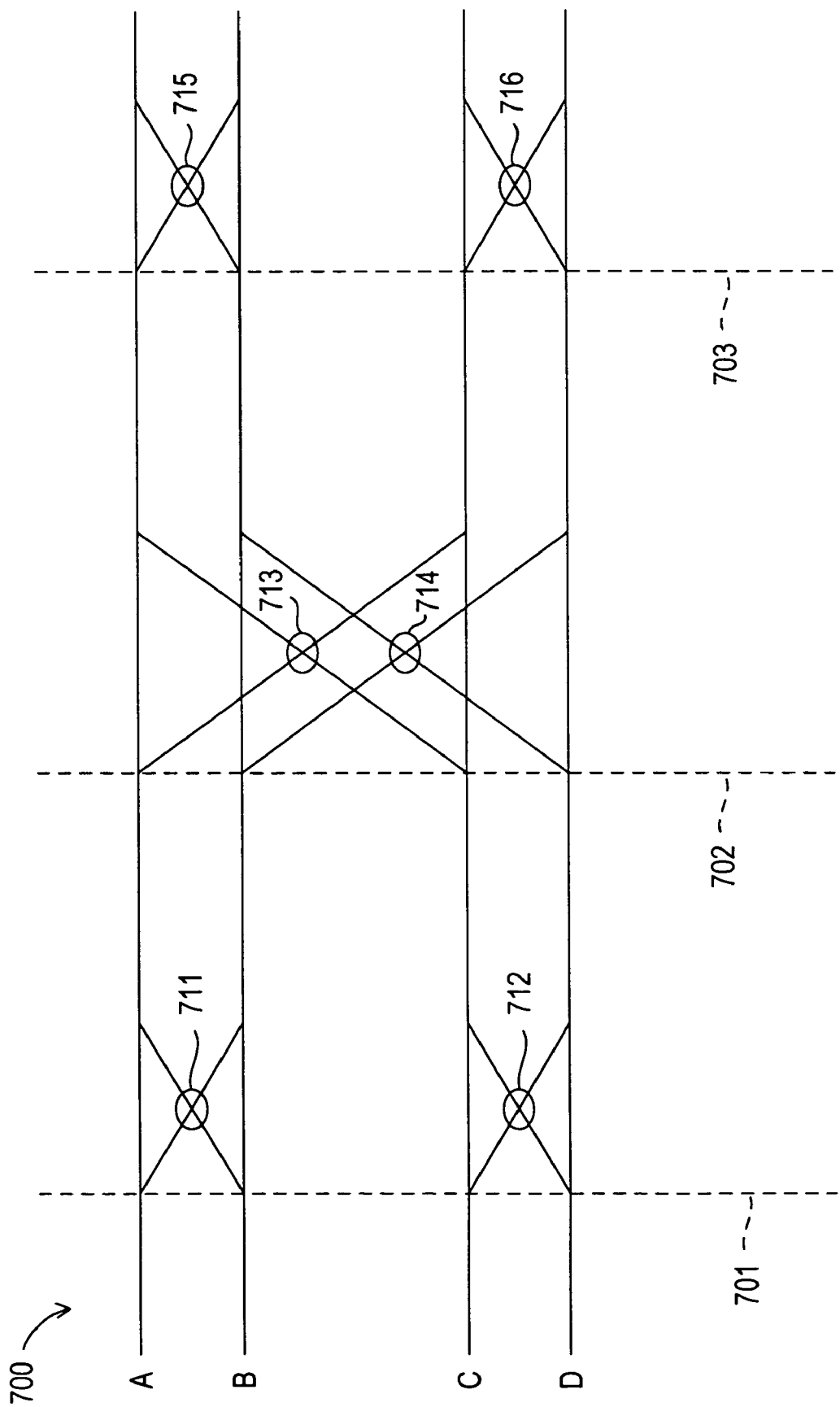
FIG. 7 is a diagram showing how a Benes network may reduce routing without blocking.

FIG. 7 shows a Benes network for permuting four user inputs A, B, C, D. It includes three switching stages 701-703. Stage 701 includes switch 711, which can swap the first and second inputs if configured to do so. Similarly, switch 712 can swap the third and fourth inputs if configured to do so. Taken together, switches 711-716 are able to permute inputs A, B, C, D into any desired ordering. For instance, consider the ordering A, C, B, D. This ordering can be achieved by configuring switches 712, 714, and 716 to swap their respective inputs. Thus, stage 701 would swap C and D to produce A, B, D, C, stage 702 would swap the second and fourth inputs to produce A, C, D, B, and stage 703 would swap the third and fourth inputs to produce A, C, B, D. Using such a Benes network would result in at most $2^6$=64 possible routing combinations (two possible settings for each switch). This value is a marked improvement over the $4^4$=256 possible combinations resulting from the multiplexer approach shown in FIG. 6.

The benefits of using a Benes network become more significant as the number of user inputs grows. For instance, an 8-input Benes network would involve twenty switches, resulting in $2^{20}$, or approximately 1,000,000 possible combinations. As described above, the multiplexer approach shown in FIG. 6 would yield approximately 16,000,000 possible combinations.

Other possible routing models exist. For example, a multi-Benes network is a variation of the Benes network in which each input can be swapped with more than one other input at each switching stage. In addition, under some circumstances an explicit routing model may not be needed. The nature of a LUT allows the permutation of user inputs by varying the LUTmask value accordingly. Thus, the routing problem would be automatically be solved by choosing appropriate values for the LE configuration bits.

Although this detailed description has focused on using the present invention to discover the configuration bits of a programmable logic device of known design to implement a user logic function, as stated above the invention also may be used to discover an efficient design to implement a particular function or set of functions. Because the invention reduces the problem to mathematics, one can simply solve the equations. Thus, to discover an architecture, one can specify an overly general architecture—e.g., an architecture that includes many more multiplexers than might possibly be needed, possibly with additional paths back to the LUT inputs, and/or XOR gates instead of the above-described AND-gate cascade structure. One then uses the method of the invention, as described above, to map onto that overly general architecture the entire library of functions that is desired to be available on the sought-after architecture.

The solution of the resulting equations may reveal a pattern that will be useful in designing the actual architecture. For example, it may be revealed that a certain structure is never used—i.e., the configuration bit or bits that control that structure always have the same value—which lets the designer know that that structure can be omitted from the design. At the same time, for the structures that are used, the most efficient patterns for implementing all of the functions that the sought-after architecture is intended to implement will emerge. In that way, the overly general architecture is trimmed down to a practical architecture that can efficiently implement the desired functions.

Figure 8:
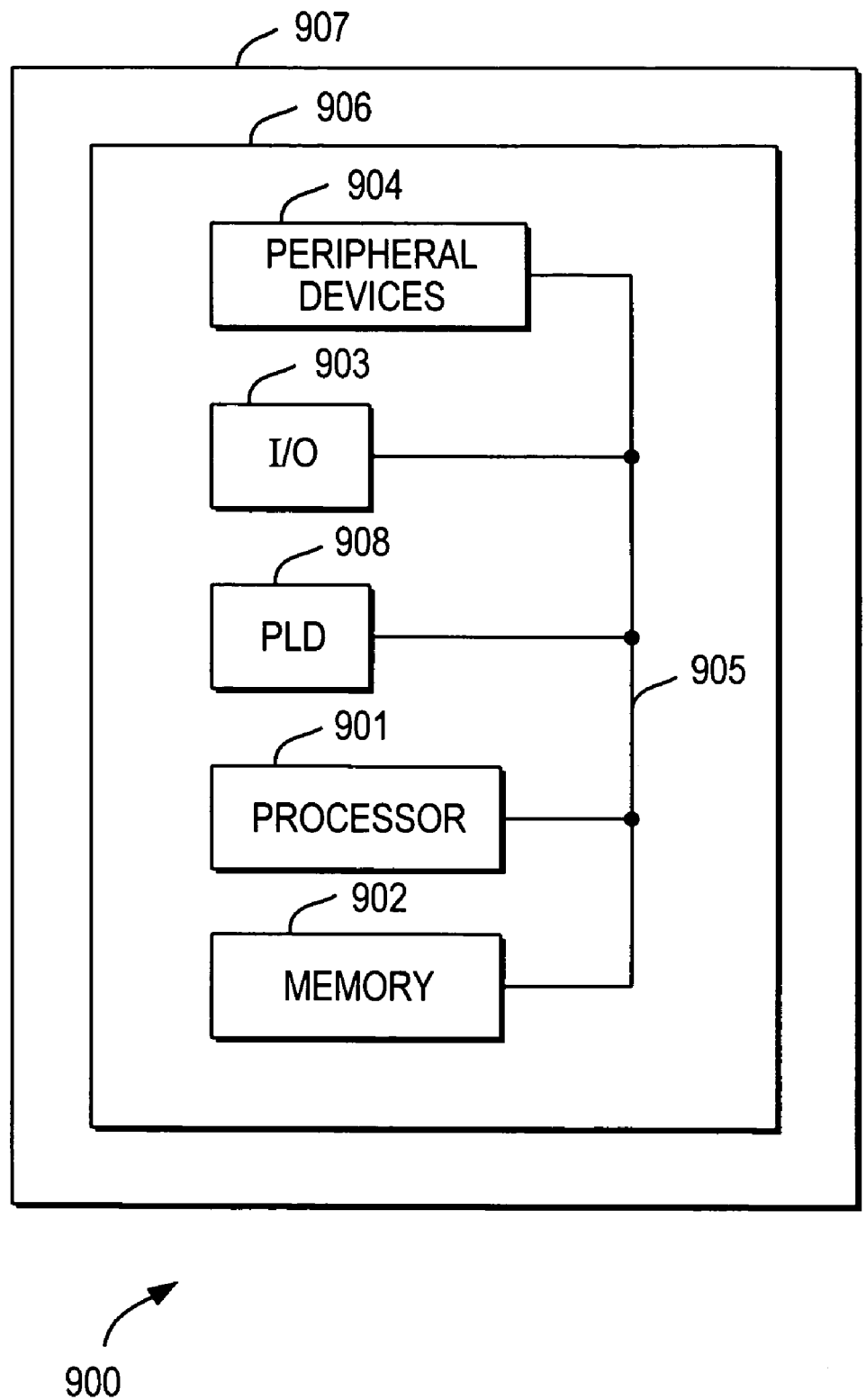
FIG. 8 is a simplified block diagram of an illustrative system employing a programmable logic device in accordance with the invention.

PLD 908 programmed (or designed) in accordance with the present invention may be used as part of a data processing system 900 shown in FIG. 8. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

System 900 can be used in a wide variety of applications, such as computer networking, data networking, instrumentation, video processing, digital signal processing, or any other application where the advantage of using programmable or reprogrammable logic is desirable. PLD 908 can be used to perform a variety of different logic functions. For example, PLD 908 can be configured as a processor or controller that works in cooperation with processor 901. PLD 908 may also be used as an arbiter for arbitrating access to a shared resources in system 900. In yet another example, PLD 908 can be configured as an interface between processor 901 and one of the other components in system 900. It should be noted that system 900 is only exemplary, and that the true scope and spirit of the invention should be indicated by the following claims.

Various technologies can be used to implement PLDs 908 as described above and incorporating this invention.

It will be understood that the foregoing is only illustrative of the principles of the invention, and that various modifications can be made by those skilled in the art without departing from the scope and spirit of the invention, and the present invention is limited only by the claims that follow.

What is claimed is:

1. A method of programming a programmable logic device, said method comprising:
   deriving a first logic expression that represents at least a portion of said programmable logic device, said first logic expression including variables representing configuration bits of said programmable logic device;
   deriving a second logic expression that represents a user logic design to be programmed onto said at least a portion of said programmable logic device; and
   computationally equating said first logic expression to said second logic expression to solve for said variables representing configuration bits of said programmable logic device.

2. The method of claim 1 wherein said deriving said first logic expression comprises including in said first logic expression logical elements that exist other than as logic in said at least a portion of said programmable logic device.

3. The method of claim 2 wherein said including comprises representing routing as a logical element.

4. The method of claim 1 wherein said first and second logic expressions are Boolean expressions.

5. The method of claim 4 wherein said first and second logic expressions include variables representing user inputs.

6. The method of claim 5 wherein said computationally equating comprises equivalency checking.

7. The method of claim 6 wherein said equivalency checking comprises determining a combination of configuration bits in said first logic expression that results in said first logic expression being equivalent to said second logic expression.

8. The method of claim 7 wherein:
   said Boolean expressions are binary decision diagrams; and
   said determining comprises:
   using universal quantification to derive from said binary decision diagrams a set of simultaneous equations, variables of said simultaneous equations including said variables representing said configuration bits, and
   solving said simultaneous equations to find said variables representing said configuration bits.

9. The method of claim 5 wherein:
   said Boolean expressions are binary decision diagrams; and
   said computationally finding comprises:
   using universal quantification to derive from said binary decision diagrams a set of simultaneous equations, variables of said simultaneous equations including said variables representing said configuration bits, and
   solving said simultaneous equations to find said variables representing said configuration bits.

10. The method of claim 1 wherein said deriving said first logic expression comprises modeling restricted routing in said first logic expression.

11. The method of claim 10 wherein said modeling restricted routing comprises modeling routing with a non-blocking restricted network.

12. The method of claim 11 wherein said modeling restricted routing with a non-blocking restricted network comprises modeling routing with a Benes network.

13. The method of claim 10 wherein said modeling restricted routing comprises:
   modeling restrictive routing in an inner loop; and
   varying inputs in an outer loop.

14. A programmable logic device programmed in accordance with the method of claim 1.

15. A digital processing system comprising:
   processing circuitry;
   a memory coupled to said processing circuitry; and
   a programmable logic device as defined in claim 14 coupled to the processing circuitry and the memory.

16. A printed circuit board on which is mounted a programmable logic device as defined in claim 14.

17. The printed circuit board defined in claim 16 further comprising:
   memory circuitry mounted on the printed circuit board and coupled to the programmable logic device.

18. The printed circuit board defined in claim 17 further comprising:
   processing circuitry mounted on the printed circuit board and coupled to the memory circuitry.

* * * * *